US 7,995,699 B2
Aug. 9, 2011

(12) United States Patent
Huang (54) DLL CIRCUIT WITH WIDE-FREQUENCY LOCKING RANGE AND ERROR-LOCKING-AVOIDING FUNCTION (75) Inventor: Hsien-Sheng Huang, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 516 days.

(21) Appl. No.: 12/203,919

(22) Filed: Sep. 4, 2008

(65) Prior Publication Data
US 2009/0262879 A1    Oct. 22, 2009

(30) Foreign Application Priority Data

Apr. 18, 2008   (TW) ............................... 97114244 A (51) Int. Cl.
*H03D 3/24* (2006.01)
(52) U.S. Cl. .......................... 375/376; 375/373; 375/354
(58) Field of Classification Search .................. 375/376, 375/373, 354
See application file for complete search history.

(56) References Cited

U.S. PATENT DOCUMENTS
7,042,971 B1 *   5/2006   Flanagan et al. ............... 375/376
* cited by examiner

*Primary Examiner* — Shuwang Liu
*Assistant Examiner* — Michael Neff
(74) *Attorney, Agent, or Firm* — Winston Hsu; Scott Margo (57) ABSTRACT

A delay-locked loop (DLL) circuit. In the evaluation period, the DLL circuit adjusts needed delay period of time for a reference clock signal by adjusting the amount of the used delay units which each of has fixed delay period of time digitally and controlling the delay period of time of the voltage control delay circuit analogically. In the locking period, the DLL circuit utilizes the delay time of the delay units, which is decided in the evaluation period, along with the voltage control delay circuit, to lock phase of the reference clock signal. In this way, the stability of the delay period of time of the voltage control delay circuit increases.

15 Claims, 8 Drawing Sheets

DLL CIRCUIT WITH WIDE-FREQUENCY LOCKING RANGE AND ERROR-LOCKING-AVOIDING FUNCTION

CROSS REFERENCE TO RELATED APPLICATIONS

The application claims the benefit of Taiwan patent application No. 097114244, which was filed on 2008 Apr. 18 and is included herein by reference.

BACKGROUND OF THE INVENTION

1. Field of the Invention

The present invention relates to a delay-locked loop circuit, and more particularly, to the delay-locked loop circuit having wide frequency locking range and error-locking-avoiding function.

2. Description of the Prior Art

Figure 1:
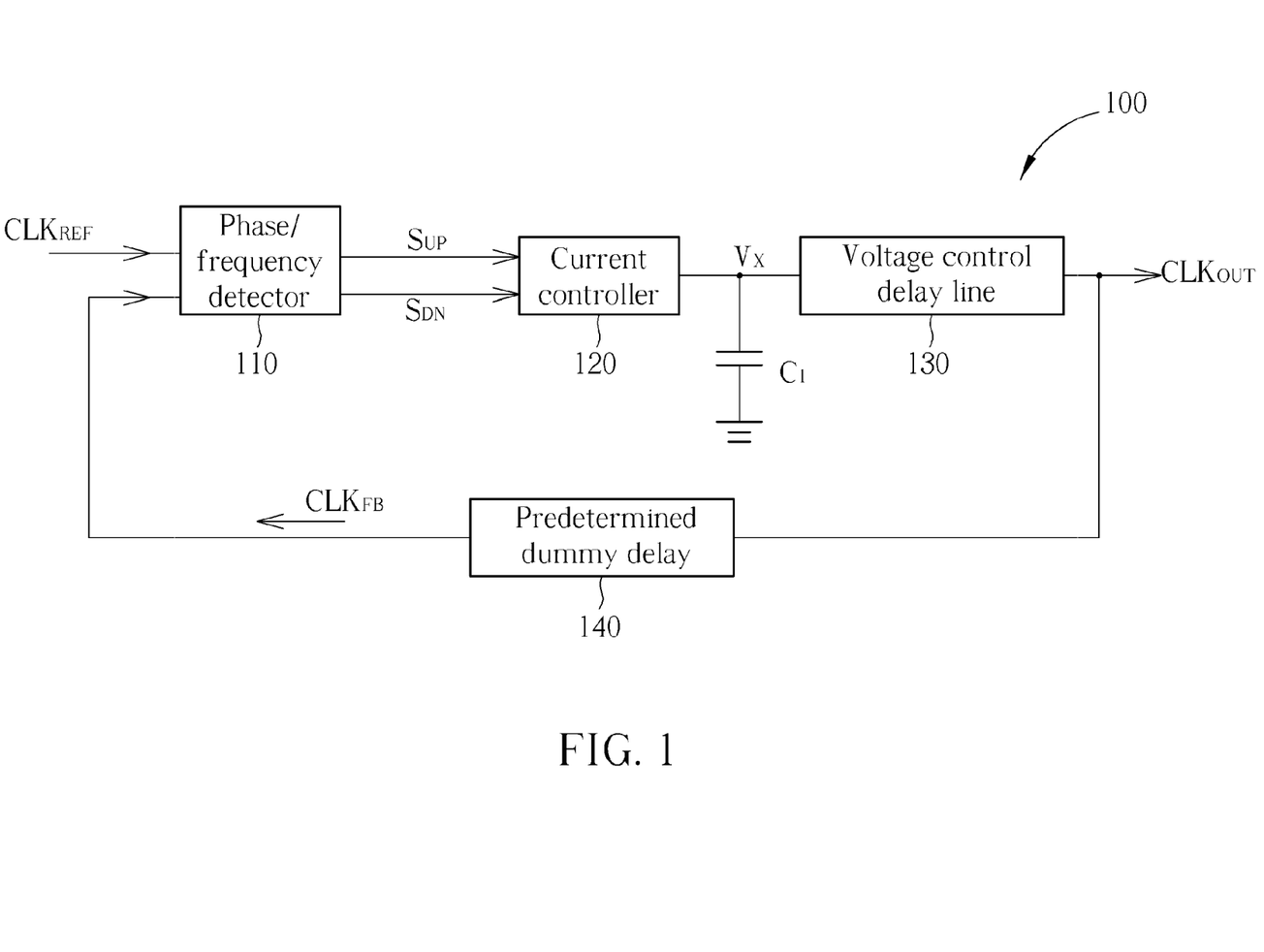
FIG. 1 is a diagram illustrating a conventional DLL circuit.

Please refer to FIG. 1. FIG. 1 is a diagram illustrating a conventional delay-locked loop (DLL) circuit 100. The DLL circuit 100 comprises a phase/frequency detector 110, a current controller 120, a capacitor $C_1$, a voltage control delay line (VCDL) 130, and a predetermined dummy delay 140.

Please continue referring to FIG. 1. The phase/frequency detector 110 comprises two input terminals for receiving a reference periodic signal $CLK_{REF}$ and a feedback periodic signal $CKL_{FB}$ respectively. The phase/frequency detector 110 determines the phase difference between the reference periodic signal $CLK_{REF}$ and the feedback periodic signal $CKL_{FB}$ and accordingly outputs the control signals $S_{UP}$ or $S_{DN}$. For the example, when the phase of the reference periodic signal $CLK_{REF}$ is ahead of the phase of the feedback periodic signal $CKL_{FB}$, the phase/frequency detector 110 outputs the control signal $S_{UP}$; otherwise, when the phase of the reference periodic signal $CLK_{REF}$ falls behind the phase of the feedback periodic signal $CKL_{FB}$, the phase/frequency detector 110 outputs the control signal $S_{DN}$.

Please continue referring to FIG. 1. The current controller 120 is coupled to the output terminal of the phase/frequency detector 110 for receiving the control signals $S_{UP}$ or $S_{DN}$. When the current controller 120 receives the control signal $S_{UP}$, the current controller 120 sources current $I_X$ with the predetermined magnitude (not shown) to capacitor $C_1$ for increasing the voltage $V_X$; when the current controller 120 receives the control signal $S_{DN}$, the current controller 120 sinks the current $I_X$ with the predetermined magnitude to the capacitor $C_1$ for decreasing the voltage $V_X$. The capacitor $C_1$ is coupled between the output terminal of the current controller 120 and a ground terminal.

Please continue referring to FIG. 1. The VCDL 130 comprises two input terminals. One input terminal of the VCDL 130 is utilized for receiving the reference periodic signal $CLK_{REF}$, and the other input terminal of the VCDL 130 is coupled to the capacitor $C_1$ for receiving the voltage $V_X$. The VCDL 130 delays the reference periodic signal $CLK_{REF}$ by a corresponding period of time $D_X$ (not shown) according to the voltage $V_X$, and the delayed reference periodic signal $CLK_{REF}$ is outputted as a delayed periodic signal $CLK_{OUT}$.

Please continue referring to FIG. 1. The predetermined dummy delay 140 is coupled between the output terminal of the VCDL 130 and the input terminal of the phase/frequency detector 110. The predetermined dummy delay 140 further delays the received delayed periodic signal $CLK_{OUT}$ by a predetermined period of time $D_P$ in order to generate the feedback periodic signal $CLK_{FB}$, and then the generated feedback periodic signal $CLK_{FB}$ is fed to the phase/frequency detector 110.

Figure 2:
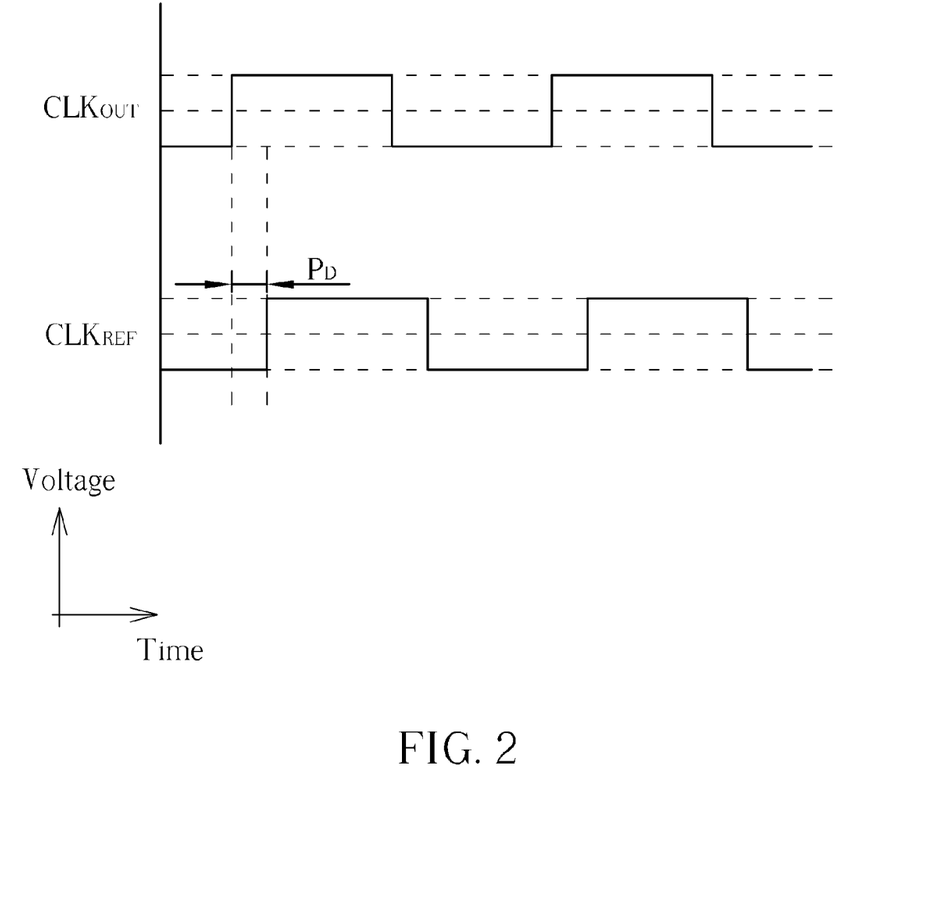
FIG. 2 is a timing diagram illustrating the relationship between a reference periodic signal and a delay periodic signal of the conventional DLL circuit.

Please refer to FIG. 2. FIG. 2 is a timing diagram illustrating relationship between the reference periodic signal $CLK_{REF}$ and the delay periodic signal $CLK_{FB}$. As shown in FIG. 2, by using the conventional DLL circuit 100, the phase of the delay periodic signal $CKL_{OUT}$ is set to prior to the phase of the reference periodic signal $CLK_{REF}$ by the predetermined phase $P_D$ (similar to the above-mentioned predetermined period of time $D_P$).

Figure 3:
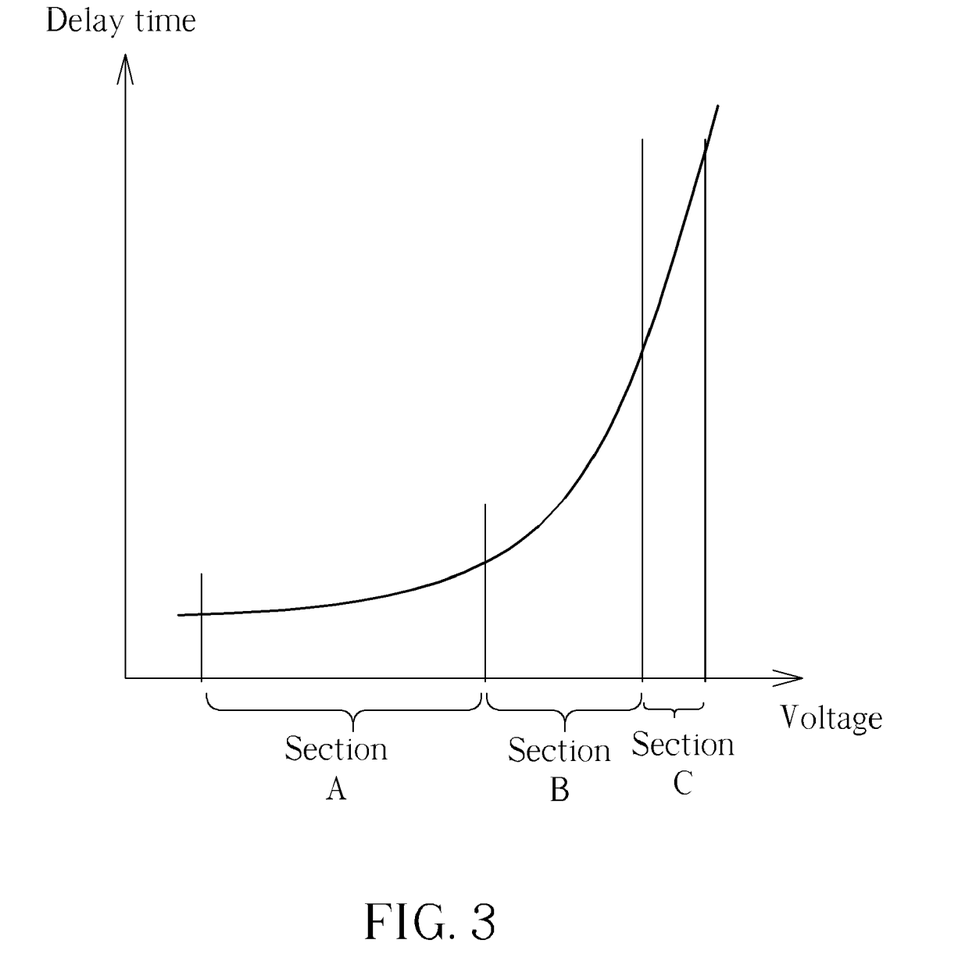
FIG. 3 is a diagram illustrating the relationship between the voltage and the delay of VCDL of the conventional DLL circuit.

Please refer to FIG. 3. FIG. 3 is a diagram illustrating the relationship between the voltage of the VCDL 130 and the delay time. The VCDL 130 controls the delay analogically. When a user needs to prolong the delay $D_X$, the user can just increase the input voltage $V_X$ of the VCDL 130. As shown in FIG. 3, the axis of the voltage can be divided into three sections: section A, section B, and section C, in which the gradient is increasing gradually from the section A to section C. In other words, in section A, the variation of the voltage $V_X$ has minor effect to the delay $D_X$. On the contrary, the delay $D_X$ varies enormously even when voltage $V_X$ is just slightly changed in section C. Therefore, when the required delay $D_X$ falls within the range of section C, the stability of the voltage $V_X$ becomes very critical. This is because the slightly variation of the voltage $V_X$ may greatly change the delay $D_X$ and to consequently result a huge error. Accordingly, the conventional DLL circuit 100 limits options for the reference periodic signal $CLK_{REF}$ and the delay phase, which is greatly inconvenient for the user.

SUMMARY OF THE INVENTION

The present invention provides a delay-locked loop circuit with wide frequency locking range and error-locking avoiding function, for generating a delayed locking periodic signal according to a reference periodic signal, the delay-locked loop circuit comprises a phase/frequency detector, a voltage controller, a voltage controlled delay circuit, a predetermined delay circuit, an adjustable delay circuit, a first switch, a second switch, and a third switch. The phase/frequency detector, comprises a first input terminal for receiving the reference periodic signal; a second input terminal; a first output terminal, wherein the phase/frequency detector outputs a first controlling signal via the first output terminal of the phase/frequency detector according to signals at the first input terminal and the second input terminal of the phase/frequency detector; and a second output terminal, wherein the phase/frequency detector outputs a second controlling signal via the second output terminal of the phase/frequency detector according to signals at the first input terminal and the second input terminal of the phase/frequency detector. The voltage controller coupled to the first and the second output terminals of the phase/frequency detector, the voltage controller outputs a corresponded voltage level according to the first controlling signal or the second controlling signal. The voltage controlled delay circuit comprises: an input terminal for receiving the reference periodic signal; a control terminal coupled to the output terminal of the voltage controller; and an output terminal, wherein the voltage controlled delay circuit delays the received reference periodic signal according to the corresponded level voltage outputted from the voltage controller. The predetermined delay circuit delays a received signal for a first predetermined time, an output terminal of the predetermined delay circuit being coupled to the second input terminal of the phase/frequency detector. The adjustable delay circuit adjusts a delay time of the adjustable delay circuit. The first switch comprises: a first terminal couples to the output terminal of the voltage controlled delay circuit; a second terminal couples to an input terminal of the predetermined delay circuit; a third terminal couples to an input terminal of the adjustable delay circuit; and a control terminal is for coupling the first terminal of the first switch to the second terminal or the third terminal of the first switch according to signals received at the control terminal of the first switch. The second switch comprises: a first terminal is for outputting the delayed locking periodic signal; a second terminal couples to the output terminal of the predetermined delay circuit; a third terminal couples to an output terminal of the adjustable delay circuit; and a control terminal is for coupling the first terminal of the second switch to the second terminal or the third terminal of the second switch according to signals received at the control terminal of the second switch. The third switch comprises: a first terminal couples to the first terminal of the second switch; a second terminal couples to the input terminal of the adjustable delay circuit; a third terminal couples to the input terminal of the predetermined delay circuit; and a control terminal is for coupling the first terminal of the third switch to the second terminal or the third terminal of the third switch according to signals received at the control terminal of the third switch.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
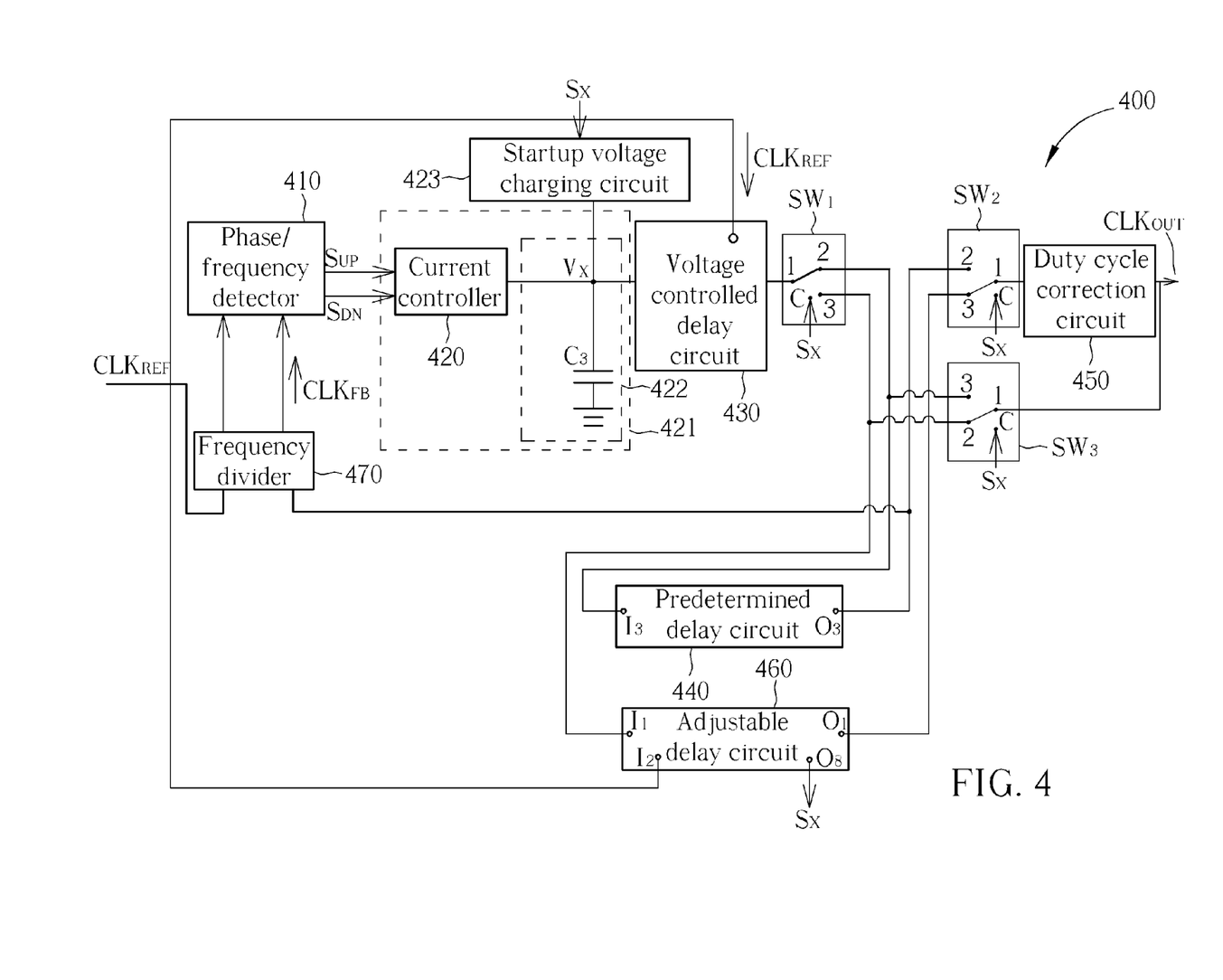
FIG. 4 is a diagram illustrating a DLL circuit according to an embodiment of the present invention.

Please refer FIG. 4. FIG. 4 is a diagram illustrating a DLL circuit 400 according to an embodiment of the present invention. The delay lock loop circuit 400 comprises a phase/frequency detector 410, a voltage controller 421, a startup voltage charging circuit 423, a voltage controlled delay circuit 430, three switches $SW_1$, $SW_2$, and $SW_3$, a predetermined delay circuit 440, a duty cycle correction (DCC) circuit 450, an adjustable delay circuit 460, and a frequency divider 470.

Please continue referring to FIG. 4. The phase/frequency detector 410 comprises two input terminals for respectively receiving a reference periodic signal $CLK_{REF}$ and a feedback periodic signal $CLK_{FB}$ that have been divided by the frequency divider 470. Please note that, a divisor of the frequency divider 470 is set to one for brevity. In other words, the reference periodic signal $CLK_{REF}$ and the feedback periodic signal $CLK_{FB}$ that after being divided by the frequency divider 470 are same as the original reference periodic signal $CLK_{REF}$ and the feedback periodic signal $CLK_{FB}$ respectively. The phase/frequency detector 410 outputs a control signal $S_{UP}$ and $S_{DN}$ according to the reference periodic signal $CLK_{REF}$ and a feedback periodic signal $CLK_{FB}$ respectively. For example, when the phase of the reference periodic signal $CLK_{REF}$ is ahead of the phase of the feedback periodic signal $CLK_{FB}$, the phase/frequency detector 410 outputs the control signal $S_{UP}$; otherwise, when the phase of the reference periodic signal $CLK_{REF}$ falls behind the phase of the feedback periodic signal $CLK_{FB}$, the phase/frequency detector 410 outputs the control signal $S_{DN}$.

Please continue referring to FIG. 4. The voltage controller 421 comprises a current controller 420 and a charging circuit 422. The charging circuit 422 comprises a capacitor $C_3$, and the capacitor $C_3$ is coupled between an output terminal (node X) of the current controller 420 and a ground terminal. The current controller 420 is coupled to an output terminal of the phase/frequency detector 410 for receiving the control signal $S_{UP}$ and $S_{DN}$. When the current controller 420 receives the control signal $S_{UP}$, the current controller 420 sources a current $I_X$ with the predetermined magnitude (not shown) to the node X for increasing the voltage $V_X$; when the current controller 420 receives the control signal $S_{DN}$, the current controller 420 sinks the current $I_X$ with the predetermined magnitude from the node X for decreasing the voltage $V_X$.

Please continue referring to FIG. 4. The voltage controlled delay circuit 430 comprises two input terminals. One of the input terminals of the voltage controlled delay circuit 430 receives the reference periodic signal $CLK_{REF}$, and the other one of the voltage controlled delay circuit 430 is coupled to the node X for receiving the voltage $V_X$. The voltage controlled delay circuit 430 delays the reference periodic signal $CLK_{REF}$ by a corresponding period of time $D_X$ (not shown) according to the magnitude of the $V_X$.

Please continue referring to FIG. 4. The switch $SW_1$ comprises a first terminal 1, a second terminal 2, a third terminal 3, and a control terminal C. The first terminal 1 of the switch $SW_1$ is coupled to an output terminal of the voltage controlled delay circuit 430, the second terminal 2 of the switch $SW_1$ is coupled to an input terminal $I_3$ of the predetermined delay circuit 440, the third terminal 3 of the switch $SW_1$ is coupled to an input terminal $I_1$ of the adjustable delay circuit 460, and the control terminal C of the switch $SW_1$ receives an evaluation/lock signal $S_X$. When the evaluation/lock signal $S_X$ is at a high voltage level, the first terminal 1 of the switch $SW_1$ is coupled to the second terminal 2 of the switch $SW_1$; when the evaluation/lock signal $S_X$ is at a low voltage level, the first terminal 1 of the switch $SW_1$ is coupled to the third terminal 3 of the switch $SW_1$. Furthermore, according to the present invention, the DLL circuit 400 is assumed in evaluation status when the evaluation/lock signal $S_X$ is at the high voltage level; the DLL circuit 400 is assumed in locking status when the evaluation/lock signal $S_X$ is at the low voltage level.

Please continue referring to FIG. 4. The switch $SW_2$ comprises a first terminal 1, a second terminal 2, a third terminal 3, and a control terminal C. The first terminal 1 of the switch $SW_2$ is coupled to an input terminal of the duty cycle correction circuit 450, the second terminal 2 of the switch $SW_2$ is coupled to an output terminal $O_3$ of the predetermined delay circuit 440, the third terminal 3 of the switch $SW_2$ is coupled to an output terminal $O_1$ of the adjustable delay circuit 460, and the control terminal C of the switch $SW_2$ receives the evaluation/lock signal $S_X$. When the evaluation/lock signal $S_X$ is at the high voltage level, the first terminal 1 of the switch $SW_2$ is coupled to the second terminal 2 of the switch $SW_2$; when the evaluation/lock signal $S_X$ is at the low voltage level, the first terminal 1 of the switch $SW_2$ is coupled to the third terminal 3 of the switch $SW_2$.

Please continue referring to FIG. 4. The switch $SW_3$ comprises a first terminal 1, a second terminal 2, a third terminal 3, and a control terminal C. The first terminal 1 of the switch $SW_3$ is coupled to an output terminal of the duty cycle correction circuit 450, the second terminal 2 of the switch $SW_3$ is coupled to the input terminal $I_1$ of the adjustable delay circuit 460, the third terminal 3 of the switch $SW_3$ is coupled to the input terminal $I_3$ of the predetermined delay circuit 440, and the control terminal C of the switch $SW_3$ receives the evaluation/lock signal $S_X$. When the evaluation/lock signal $S_X$ is at the high voltage level, the first terminal 1 of the switch $SW_3$ is coupled to the second terminal 2 of the switch $SW_3$; when the evaluation/lock signal $S_X$ is at the low voltage level, the first terminal 1 of the switch $SW_3$ is coupled to the third terminal 3 of the switch $SW_3$.

Please continue referring to FIG. 4. The predetermined delay circuit 440 comprises the input terminal $I_3$ and the output terminal $O_3$. The predetermined delay circuit 440 delays the signal that received at the input terminal $I_3$ by a predetermined period of time $D_P$ (not shown), and then outputs the delayed signal at its output terminal $O_3$.

Please continue referring to FIG. 4. The adjustable delay circuit 460 comprises input terminals $I_1$, and $I_2$, and output terminals $O_1$, and $O_8$. The input terminal $I_2$ of the adjustable delay circuit 460 is utilized for receiving the reference periodic signal $CLK_{REF}$. The output terminal $O_8$ of the adjustable delay circuit 460 is utilized for outputting the evaluation/lock signal $S_X$. When the adjustable delay circuit 460 is in the evaluation status (when the evaluation/lock signal $S_X$ is at the high voltage level), the adjustable delay circuit 460 determines the size of the delay $D_A$ according to the signals received at the input terminals 11 and 12; and when the adjustable delay circuit 460 is in the locking status (when the evaluation/lock signal $S_X$ is at the low voltage level), the adjustable delay circuit 460 outputs a signal delayed by the delay $D_A$ (predetermined in the evaluation status), and the signal is received at the input terminal $I_1$ of the adjustable delay circuit 460.

Please continue referring to FIG. 4. The input terminal of the duty cycle correction circuit 450 is coupled to the first terminal 1 of the switch $SW_2$, and the output terminal is utilized for outputting a periodic signal $CLK_{OUT}$. The duty cycle correction circuit 450 is utilized for adjusting the duty cycle of the received signal in order to output a periodic signal having a duty ratio of 50%/50%. Accordingly, both the rising edge and the falling edge of the periodic signal that are outputted by the duty cycle correction circuit 450 can be provided to the external circuits.

Please continue referring to FIG. 4. An input terminal of the frequency divider 470 is coupled to the output terminal $O_3$ of the predetermined delay circuit 440 for dividing the received signal to generate the feedback periodic signal $CLK_{FB}$, another input terminal of the divider 470 receives the reference periodic signal $CLK_{REF}$, an output terminal of the divider 470 is coupled to the phase/frequency detector 410 for outputting a divided reference periodic signal, and another output terminal of the divider 470 is coupled to the phase/frequency detector 410 for outputting a divided feedback periodic signal $CLK_{FB}$. The divider 470 is utilized for frequency dividing the received periodic signal, and the divisor can be set such as 1, 2, or 3. The periodic signal is transmitted to the phase/frequency detector 410 after being divided by the divider 470. Please note that, in the following description of the present invention, the divisor of the frequency divider 470 is set to 1 for brevity.

Figure 5:
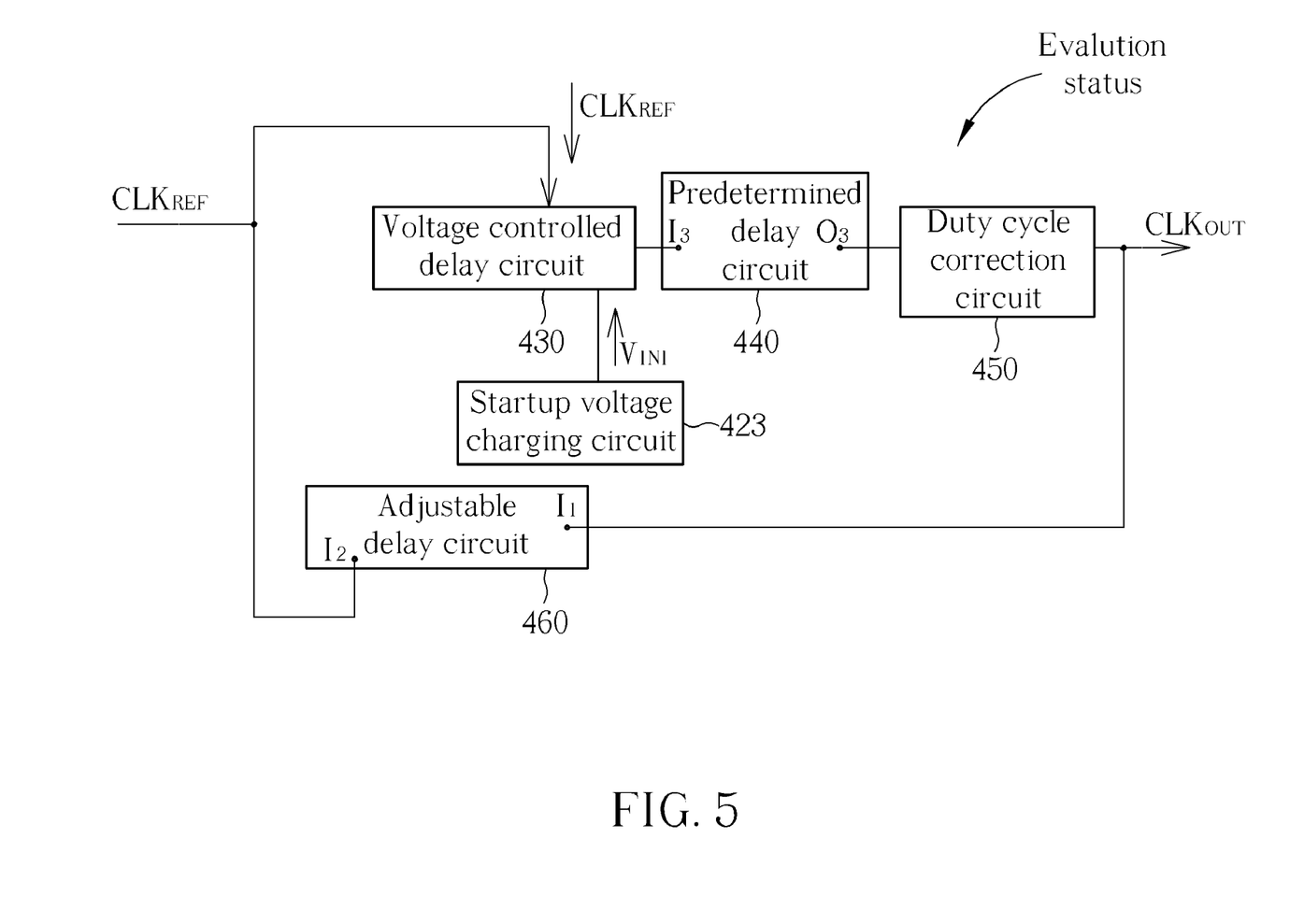
FIG. 5 is a diagram illustrating the DLL circuit of the present invention in the evaluation status.

Please refer to FIG. 5. FIG. 5 is a diagram illustrating the DLL circuit 400 of the present invention in the evaluation status. Assuming the evaluation/lock signal is at the high voltage level (logic "1"), then the first terminal 1 of all of the switches $SW_1 \sim SW_3$ are coupled to the corresponding second terminal 2 as shown in the FIG. 5. In FIG. 5, when the startup voltage charging circuit 423 is in the evaluation status (when the evaluate/lock signal $S_X$ is at the high voltage level), a startup voltage $V_{INI}$ is generated for providing to the voltage controlled delay circuit 430 to be the control voltage $V_X$. Then, the control voltage $V_X$ is maintained to a fixed value, which is the startup voltage $V_{INI}$. In FIG. 5, the reference periodic signal $CLK_{REF}$ is delayed by voltage controlled delay circuit 430, and then inputted to the predetermined delay circuit 440. Next, the signal delayed by the delay $D_P$ of the predetermined delay circuit 440 is inputted to the duty cycle correction circuit 450. Then, the periodic signal $CLK_{OUT}$ that has been corrected by the duty cycle correction circuit 450 is inputted to the adjustable delay circuit 460.

Figure 6:
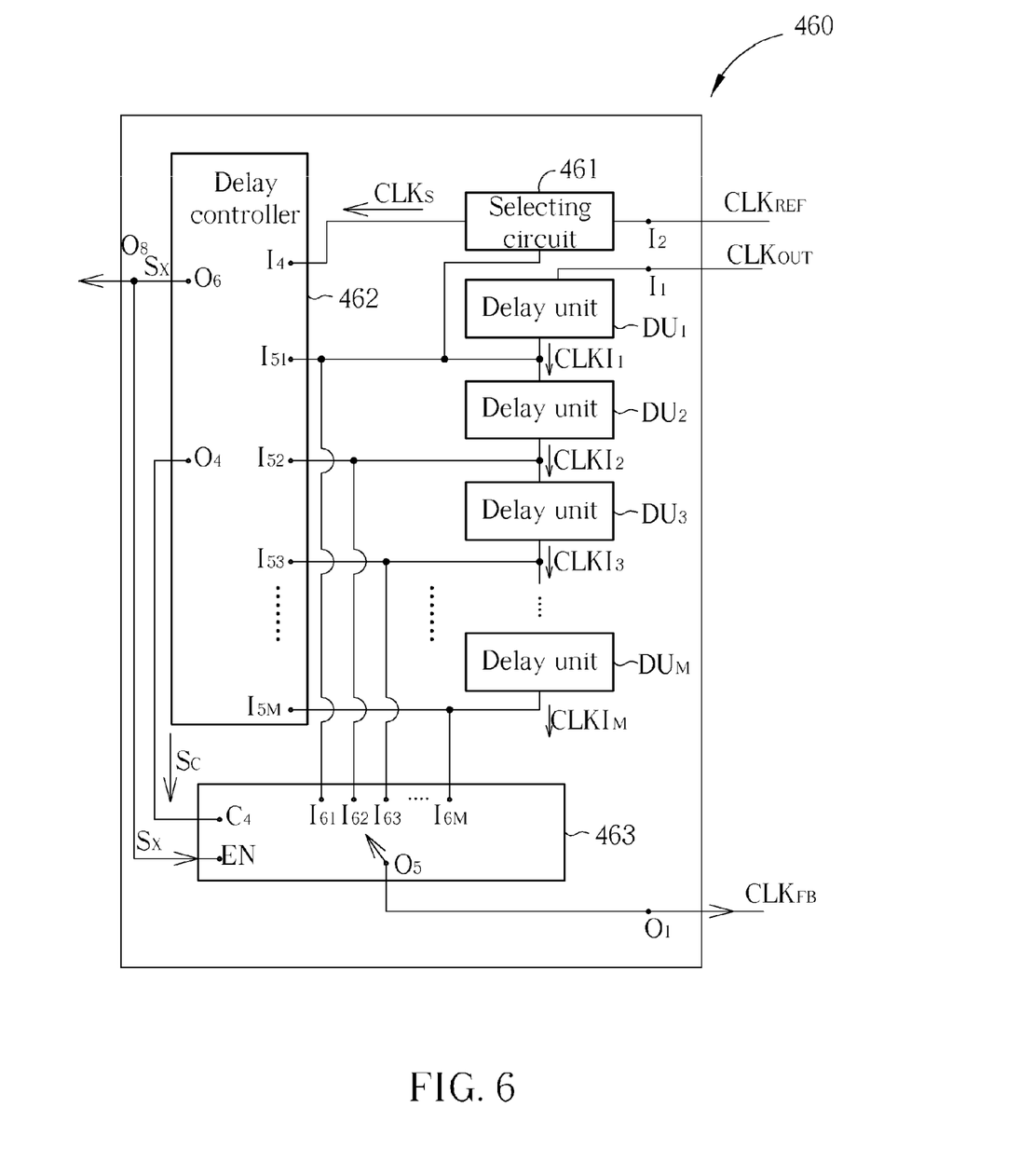
FIG. 6 is a diagram illustrating an adjustable delay circuit of the DLL circuit of the present invention in the evaluation status.

Please refer to FIG. 6. FIG. 6 is a diagram illustrating the adjustable delay circuit 460 of the present invention in the evaluation status. The adjustable delay circuit 460 comprises a selecting circuit 461, a delay controller 462, a multiplexer 463, and a plurality of delay units $DU_1$ 18 $DU_M$ (i.e., M delay units in the embodiment).

Please refer to FIG. 6 again. Each of the delay units $DU_1$, $DU_2$, $DU_3$, . . . , and $DU_M$ comprises an input terminal and an output terminal. Each of the delay units $DU_1$, $DU_2$, $DU_3$, . . . , and $DU_M$ delays it received signal by a predetermined period of time $D_T$, and then outputs as the delayed periodic signals $CLKI_1$, $CLKI_2$, $CLKI_3$, . . . , and $CLKI_M$, respectively. The delay units $DU_1 \sim DU_M$ are connected in series. In other words, the input terminal of the delay unit $DU_2$ is coupled to the output terminal of the delay unit $DU_1$ for receiving the delayed periodic signal $CLKI_1$; the input terminal of the delay unit $DU_3$ is coupled to the output terminal of the delay unit $DU_2$ for receiving the delayed periodic signal $CLKI_2$; the input terminal of the delay unit $DU_4$ is coupled to the output terminal of the delay unit $DU_3$ for receiving the delayed periodic signal $CLKI_3$, . . . , and the input terminal of the delay unit $DU_M$ is coupled to the output terminal of the delay unit $DU_{(M-1)}$ for receiving the delayed periodic signal $CLKI_{(M-1)}$. Furthermore, the input terminal of the delay unit $DU_1$ is coupled to the input terminal $I_1$ of the adjustable delay circuit 460 for receiving the periodic signal $CLK_{OUT}$.

Please continue referring to FIG. 6. The selecting circuit 461 comprises two input terminals and an output terminal, one of the input terminals of the selecting circuit 461 is coupled to an input terminal $I_2$ of the adjustable delay circuit 460 for receiving the reference periodic signal $CLK_{REF}$, and the other input terminal of the selecting circuit 461 is coupled to the output terminal of the delay unit $DU_1$ for receiving the delayed periodic signal $CLKI_1$. The output terminal of the selecting circuit 461 is utilized for outputting a selected periodic signal $CLK_S$ after the selecting circuit 461 is selected. As long as the selecting circuit 461 detects that the reference periodic signal $CLK_{REF}$ is at the low voltage level and a first rising edge occurs in the delayed periodic signal $CLKI_1$, the selecting circuit 461 outputs the reference periodic signal $CLK_{REF}$ as the selected periodic signal $CLK_S$.

Please continue referring to FIG. 6. The delay controller 462 comprises a first input terminal $I_4$, a plurality (i.e., M) of second input terminals $I_{51}$, $I_{52}$, $I_{53}$, . . . , and $I_{5M}$, an output terminal $O_4$, and an output $O_6$. The input terminal $I_4$ of the delay controller 462 is coupled to the output terminal of the selecting circuit 461 for receiving the selected periodic signal $CLK_S$. The output terminal $O_6$ of the delay controller 462 is coupled to the output terminal $O_8$ of the adjustable delay circuit 460 for outputting the evaluation/lock signal $S_X$. Each of the M second input terminals $I_{51}$~$I_{5M}$ of the delay controller 462 is coupled to a corresponding output terminal of the delay units $DU_1$~$DU_M$ for receiving the delayed periodic signal $CLKI_1$~$CLKI_M$ respectively. The delay controller 462 generates a control signal $S_C$ to the control terminal C of the multiplexer 463 to control the internal coupling of the multiplexer 463 according to the received selected periodic signal $CLK_S$ and the delayed periodic signals $CLKI_1$~$CLKI_M$. When in the evaluation status (i.e., when the evaluation/lock signal $S_X$ is at the high voltage level), the delay controller 462 adjusts the value of the control signal $S_C$ according to the received selected periodic signal $CLK_S$ and the delayed periodic signals $CLKI_1$~$CLKI_M$. Then, when in the locking status (i.e., when the evaluation/lock signal $S_X$ is at the low voltage level), the delay controller 462 outputs the value of the control signal $S_C$ that has been decided in the evaluation status to the control terminal C of the multiplexer 463. Furthermore, the delay controller 462 sets the voltage level of the evaluation/lock signal $S_X$ according to the delay unit $DU_M$ (the $M^{th}$ delay unit), and then outputs to the output terminal $O_6$ of the delay controller 462. More specifically, before the delay unit $DU_M$ outputs the delayed periodic signal $CLKI_M$, the delay controller 462 sets the evaluation/lock signal $S_X$ at the high voltage level; and after the delay unit $DU_M$ outputs the delayed periodic signal $CLKI_M$, the delay controller 462 sets the evaluation/lock signal $S_X$ at the low voltage level.

Please continue referring to FIG. 6. The multiplexer 463 comprises a plurality (i.e. M) of input terminals $I_{61}$, $I_{62}$, $I_{63}$, . . . , and $I_{6M}$, a control terminal C, an activation terminal EN, and an output terminal $O_5$. Each of the input terminals $I_{61}$, $I_{62}$, $I_{63}$, . . . , and $I_{6M}$ of the multiplexer 463 is coupled to the corresponding output terminal of the delay units $DU_1$~$DU_M$ for receiving the delayed periodic signal $CLKI_1$~$CLKI_M$ respectively. The control terminal C of multiplexer 463 is coupled to the output terminal $O_4$ of the delay controller 462 for receiving the control signal $S_C$. The activation terminal EN of the multiplexer 463 is utilized for receiving the evaluation/lock signal $S_X$. The output terminal $O_5$ of the multiplexer 463 is coupled to the output terminal $O_1$ of the adjustable delay circuit 460 for transmitting one of the received delayed periodic signal to the output terminal $O_1$ of the adjustable delay circuit 460 as the feedback periodic signal $CLK_{FB}$. The multiplexer 463 couples the output terminal $O_5$ of the multiplexer 463 to one of the M input terminals $I_{61}$, $I_{62}$, $I_{63}$, . . . , and $I_{6M}$ of the multiplexer 463 according to the control signal $S_C$. When in the evaluation status (i.e., when the evaluation/lock signal $S_X$ is at the high voltage level), the multiplexer 463 is inactivated, i.e., the output terminal $O_5$ of the multiplexer 463 does not output any signal. When in the locking status (i.e., when the evaluation/lock signal $S_X$ is at the low voltage level), the multiplexer 463 is activated, and outputs the feedback periodic signal $CLK_{FB}$ at the output terminal $O_5$ of the multiplexer 463 according to the control signal $S_C$ and one of the M input terminals $I_{61}$, $I_{62}$, $I_{63}$, . . . , and $I_{6M}$.

Figure 7:
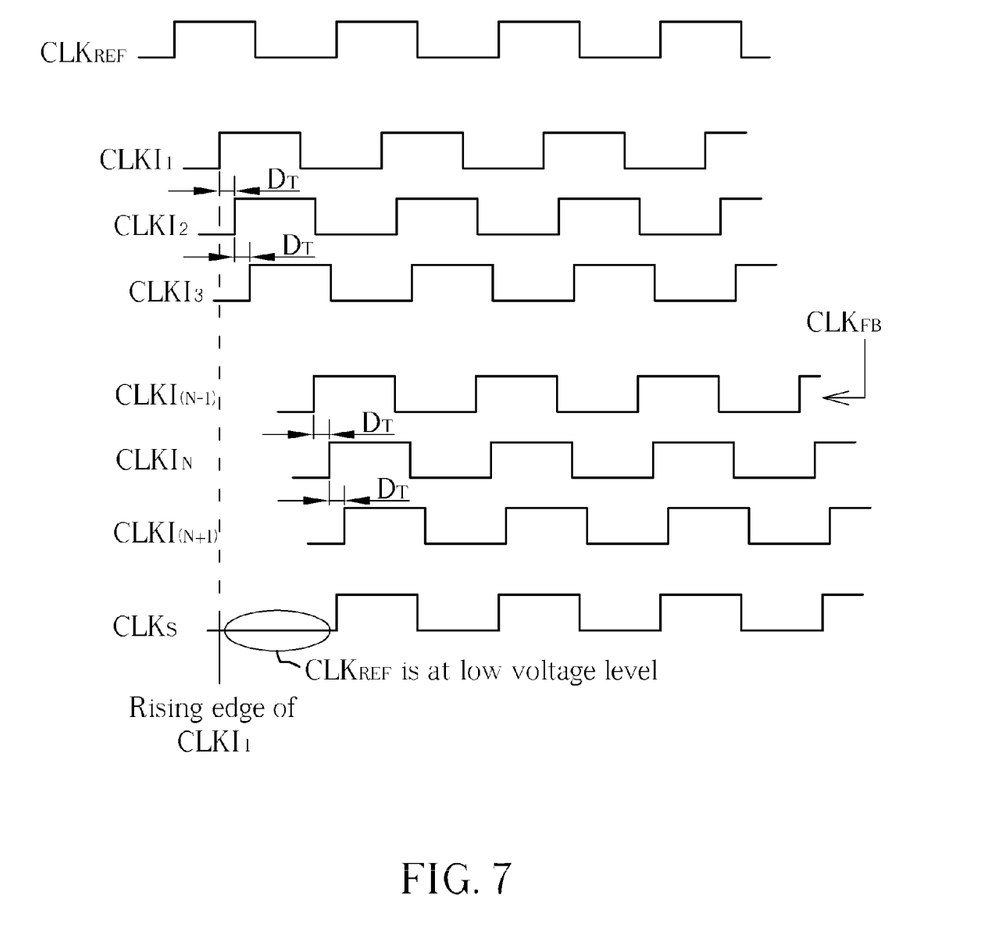
FIG. 7 is a timing diagram illustrating the relationship between a reference periodic signal, delayed periodic signals, and a selected periodic signal.

Please refer to FIG. 7. FIG. 7 is a timing diagram illustrating relationship between the reference periodic signal $CLK_{REF}$, delayed periodic signals $CLKI_1$~$CLKI_M$, and the selected periodic signal $CLK_S$. Each of the delayed periodic signals $CLKI_1$~$CLKI_M$ is delayed by a predetermined period of time $D_T$ compared with the previous one, and the selected periodic signal $CLK_S$ is generated when the reference periodic signal $CLK_{REF}$ is at the low voltage level and after the first rising edge of the delayed periodic signal $CLK_1$ occurs. Then, the delay controller 462 transmits the control signal $S_C$ according to the selected periodic signal $CLK_S$ and the delayed periodic signal $CLKI_1$~$CLKI_M$. In FIG. 7, when the first rising edge of the selected periodic signal $CLK_S$ occurs between the first rising edges of the delayed periodic signals $CLKI_N$ and $CLKI_{(N+1)}$, the delay controller 462 transmits the control signal $S_C$ to the multiplexer 463 in order to coupled the input terminal $I_{6(N-1)}$ of the multiplexer 463 to the output terminal $O_5$ of the multiplexer 463, and to output the delayed periodic signal $CLKI_{(N-1)}$ as the feedback periodic signal $CLK_{FB}$. Accordingly, the error phase locking situation of the DLL circuit 400 of the present invention can be avoided. Furthermore, the predetermined delay $D_A$ for delaying the feedback signal $CLK_{FB}$ outputted from the adjustable delay circuit 460 is $(N-1)D_T$.

Figure 8:
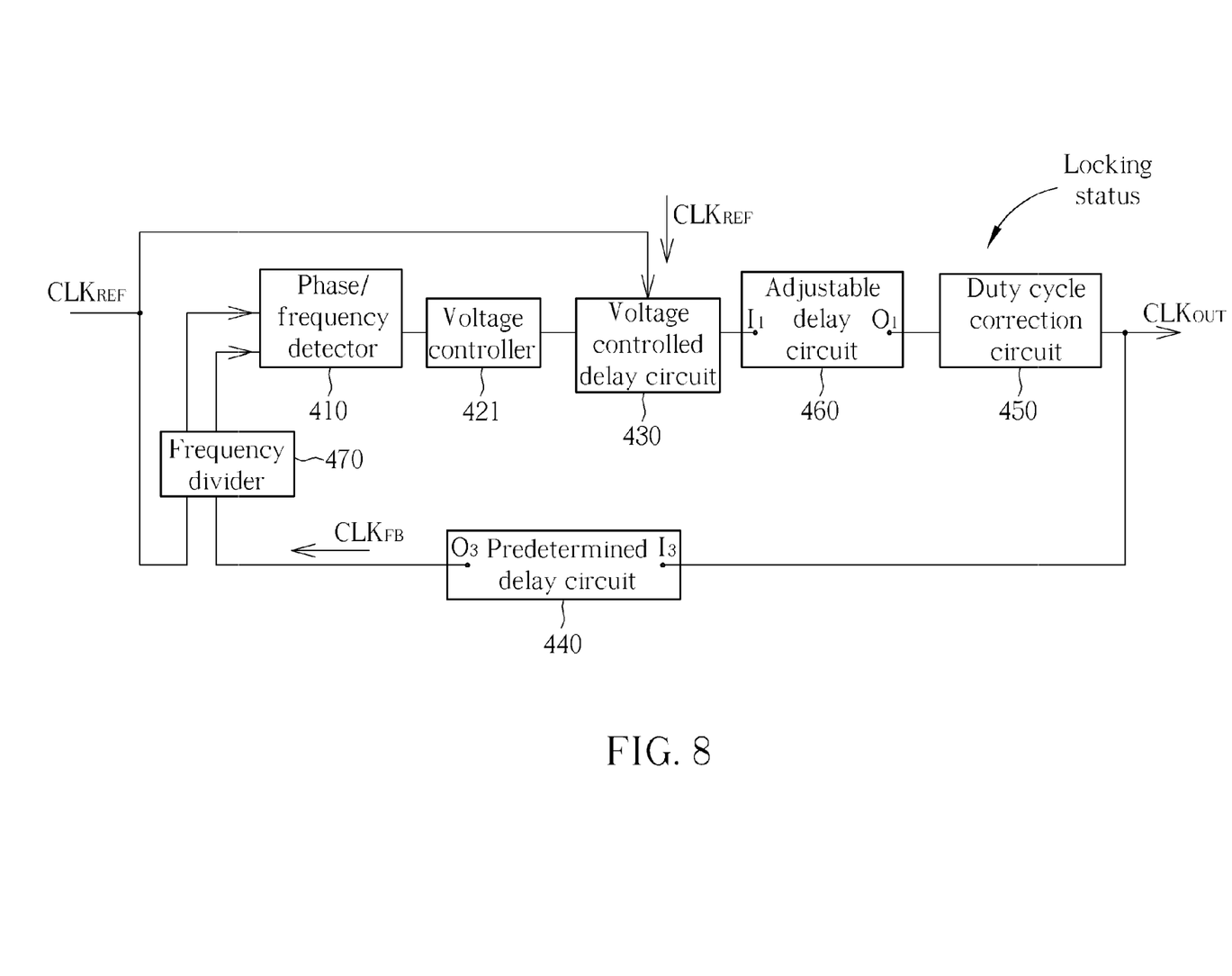
FIG. 8 is a diagram illustrating the DLL circuit of the present invention in the locking status.

Please refer to FIG. 8. FIG. 8 is a diagram illustrating the DLL circuit 400 of the present invention in the locking status. Assuming in the locking status, the evaluation/lock signal is at the low voltage level (i.e., logic "0"), then all of the first terminals 1 of the switches SW1~SW3 are coupled to the third terminals 3 correspondingly as shown in FIG. 8. In FIG. 8, the reference periodic signal $CLK_{REF}$ is inputted to the adjustable delay circuit 460 after being delayed by the voltage controlled delay circuit 430. Next, the delayed reference periodic signal $CLK_{REF}$ is inputted to the duty cycle correction circuit 450 after being delayed again by the adjustable delay circuit 460 with the delay $(N-1)D_T$. Then, the periodic signal $CLKI_{OUT}$ that is adjusted by the duty cycle correction circuit 450 is inputted to the predetermined delay circuit 440. Then, the predetermined delay circuit 440 delays the received periodic signal $CLK_{OUT}$ by the delay $D_P$, and feedbacks to the phase/frequency detector 410 as the feedback signal $CLK_{FB}$ via the frequency divider 470.

When the DLL circuit 400 of the present invention is in the evaluation status, the required number of the delay unit DU (i.e., the magnitude of the delay $D_A$) of the adjustable delay circuit 460 is determined by the phase difference between the original reference periodic signal $CLK_{REF}$ and the periodic signal $CLKI_{OUT}$ outputted after the voltage controlled delay circuit 430, the predetermined delay circuit 440, and the duty cycle correction circuit 450. In addition, when in the locking status, the DLL circuit 400 of the present invention utilizes the delay obtained from the used delay units DU determined in the evaluation status to perform the delay lock upon the reference periodic signal $CLK_{REF}$. Accordingly, the usage of the voltage in the section C of the FIG. 3 can be avoided in the voltage controlled delay circuit 430. In other words, if the delay required by the entire DLL circuit 400 is $D_Y$, then the delay $D_Y$ should equal to the delay $D_X$ in addition with the delay $(N-2)D_T$. Accordingly, the delay $(N-2)D_T$ reduces the delay $D_X$, which reduces the required voltage in the voltage controlled delay circuit 430. Consequently, the voltage required in the voltage controlled delay circuit 430 does not fall in section C, as shown in FIG. 3, and the stability of the DLL circuit 400 is increased. Furthermore, the range of the entire delay required by the DLL circuit 400 of the present invention is prolonged, and the DLL circuit 400 of the present invention can be applied in the field required wide frequency range.

To sum up, the DLL circuit 400 of the present invention is more adaptive for the user since the DLL circuit 400 has a wider frequency locking range and low error locking rate, providing greater convenience.

Those skilled in the art will readily observe that numerous modifications and alterations of the device and method may be made while retaining the teachings of the invention.

What is claimed is:

1. A delay-locked loop circuit with wide frequency locking range and error-locking avoiding function, for generating a delayed locking periodic signal according to a reference periodic signal, the delay-locked loop circuit comprising:
   a phase/frequency detector, comprising;
   a first input terminal, for receiving the reference periodic signal;
   a second input terminal;
   a first output terminal, wherein the phase/frequency detector outputs a first controlling signal via the first output terminal of the phase/frequency detector according to signals at the first input terminal and the second input terminal of the phase/frequency detector; and
   a second output terminal, wherein the phase/frequency detector outputs a second controlling signal via the second output terminal of the phase/frequency detector according to signals at the first input terminal and the second input terminal of the phase/frequency detector;
   a voltage controller, coupled to the first and the second output terminals of the phase/frequency detector, the voltage controller outputs a corresponded voltage level according to the first controlling signal or the second controlling signal;
   a voltage controlled delay circuit, comprising:
   an input terminal, for receiving the reference periodic signal;
   a control terminal, coupled to an output terminal of the voltage controller; and
   an output terminal, wherein the voltage controlled delay circuit delays the received reference periodic signal according to the corresponded level voltage outputted from the voltage controller;
   a predetermined delay circuit, for delaying a received signal for a first predetermined time, an output terminal of the predetermined delay circuit being coupled to the second input terminal of the phase/frequency detector;
   an adjustable delay circuit, for adjusting a delay time of the adjustable delay circuit;
   a first switch, comprising:
   a first terminal, coupled to the output terminal of the voltage controlled delay circuit;
   a second terminal, coupled to an input terminal of the predetermined delay circuit;
   a third terminal, coupled to an input terminal of the adjustable delay circuit; and
   a control terminal, for coupling the first terminal of the first switch to the second terminal or the third terminal of the first switch according to signals received at the control terminal of the first switch;
   a second switch, comprising:
   a first terminal, for outputting the delayed locking periodic signal;
   a second terminal, coupled to the output terminal of the predetermined delay circuit;
   a third terminal, coupled to an output terminal of the adjustable delay circuit; and
   a control terminal, for coupling the first terminal of the second switch to the second terminal or the third terminal of the second switch according to signals received at the control terminal of the second switch; and
   a third switch, comprising:
   a first terminal, coupled to the first terminal of the second switch;
   a second terminal, coupled to the input terminal of the adjustable delay circuit;
   a third terminal, coupled to the input terminal of the predetermined delay circuit; and
   a control terminal, for coupling the first terminal of the third switch to the second terminal or the third terminal of the third switch according to signals received at the control terminal of the third switch.

2. The delay-locked loop circuit of claim 1, wherein the control terminal of the first switch, the control terminal of the second switch, and the control terminal of the third switch receive an evaluation/lock signal.

3. The delay-locked loop circuit of claim 2, wherein when the evaluation/lock signal is at a first predetermined voltage level, the first terminal of the first switch is coupled to the second terminal of the first switch, the first terminal of the second switch is coupled to the second terminal of the second switch, the first terminal of the third switch is coupled to the second terminal of the third switch.

4. The delay-locked loop circuit of claim 3, wherein when the evaluation/lock signal is at a second predetermined voltage level, the first terminal of the first switch is coupled to the third terminal of the first switch, the first terminal of the second switch is coupled to the third terminal of the second switch, the first terminal of the third switch is coupled to the third terminal of the third switch.

5. The delay-locked loop circuit of claim 4, wherein the adjustable delay circuit comprises:
   M delay units connected in series, wherein an input terminal of the Pth delay unit is coupled to an output terminal of the (P−1)th delay unit, and delays a received signal for a second predetermined time, and an input terminal of the first delay unit is coupled to the third terminal of the first switch;
   a delay controller, comprising:
   a first input terminal, coupled to the first input terminal of the phase/frequency detector, for receiving the reference periodic signal;
   M second input terminals, coupled to the output terminals of the corresponding M delay units respectively;
   a first output terminal, wherein when a Mth second input terminal of the delay controller does not receive a delayed signal from a Mth delay unit, the delay controller outputs the evaluation/lock signal being at the first predetermined voltage level at the first output terminal, and when the Mth second input terminal of the delay controller receives the delayed signal from the Mth delay unit, the delay controller outputs the evaluation/lock signal being at the second predetermined voltage level at the first output terminal;
   a second output terminal, wherein the delay controller outputs a delayed control signal via the second output terminal of the delay controller according to the evaluation/lock signal, the reference periodic signal, and signals received at the Mth second input terminal of the delay controller;
   a multiplexer, comprising:
   a control terminal, coupled to the second output terminal of the delay controller, for receiving the delay control signal;
   an activate terminal, coupled to the first output terminal of the delay controller, for receiving the evaluation/lock signal;
   M input terminals, coupled to the output terminals of the corresponding M delay units respectively; and
   an output terminal, wherein the multiplexer couples the output terminal of the multiplexer to one of the M input terminals of the multiplexer according to the delay control signal and the evaluate/lock signal;

wherein M is a positive integer and P is a positive integer.

6. The delay-locked loop circuit of claim 5, wherein when the evaluation/lock signal is at the second predetermined voltage level, the delay controller adjusts the delay control signal according to the reference periodic signal and signals received at the M second input terminals of the delay controller.

7. The delay-locked loop circuit of claim 5, wherein when the evaluation/lock signal is at the first predetermined voltage level, the delay controller does not adjust the delay control signal.

8. The delay-locked loop circuit of claim 7, wherein when the evaluation/lock signal is at the second predetermined voltage level, the multiplexer outputs one of received signals at the M input terminals of the multiplexer via the output terminal of the multiplexer according to the delay control signal.

9. The delay-locked loop circuit of claim 5, wherein the adjustable delay circuit further comprises a selecting circuit, the selecting circuit is coupled to the first input terminal of the delay controller and the output terminal of the first delay unit, and when the selecting circuit detects the reference periodic signal is at a low voltage level and a rising edge is outputted at the output terminal of the first delay unit, the selecting circuit inputs the reference periodic signal to the first input terminal of the delay controller.

10. The delay-locked loop circuit of claim 7, wherein when a rising edge of the reference periodic signal received at the first input terminal of the delay controller is between the rising edges of the received signals at the Nth second input terminal and the (N+1)th second input terminal of the delay controller, the delay controller outputs the delay control signal to the multiplexer for coupling the output terminal of the multiplexer to the (N−1)th input terminal of the multiplexer, wherein $1 \leq N \leq M$, and N is a positive integer.

11. The delay-locked loop circuit of claim 4, wherein the first predetermined voltage level is a high voltage level, and the second predetermined voltage level is a low voltage level.

12. The delay-locked loop circuit of claim 1, further comprising an startup voltage charging circuit, coupled to the output terminal of the voltage controller, and when the evaluation/lock signal being at the first predetermined voltage level, the startup voltage charging circuit providing a startup voltage to the voltage controller.

13. The delay-locked loop circuit of claim 1, wherein the voltage controller comprises:
a current controller, having an input terminal coupled to the output terminal of the phase/frequency detector, and having an output terminal coupled to the input terminal of the voltage controller, for outputting a predetermined current at the output terminal of the current controller according to the first control signal or the second control signal; and
a charging circuit, coupled to the output terminal of the current controller, comprising:
a first capacitor, coupled between the output terminal and a ground terminal.

14. The delay-locked loop circuit of claim 1, further comprising a duty cycle adjusting circuit, coupled to the first terminal of the second switch.

15. The delay-locked loop circuit of claim 1, further comprising a frequency divider, the frequency divider comprising:
a first input terminal, for receiving the reference periodic signal;
a second input terminal, coupled to the output terminal of the predetermined delay circuit;
a first output terminal, coupled to the first input terminal of the phase/frequency detector, for outputting a first signal which is the reference periodic signal divided with a divisor; and
a second output terminal, coupled to the second input terminal of the phase/frequency detector, for outputting a second signal which is a third signal outputted from the predetermined delay circuit divided with the divisor.

* * * * *